United States Patent
Tang et al.

(10) Patent No.: US 8,710,602 B2
(45) Date of Patent: Apr. 29, 2014

(54) METHOD AND SYSTEM FOR PROVIDING MAGNETIC JUNCTIONS HAVING IMPROVED CHARACTERISTICS

(75) Inventors: Xueti Tang, Fremont, CA (US); Dmytro Apalkov, San Jose, CA (US); Steven M. Watts, Mountain View, CA (US); Kiseok Moon, Pleasanton, CA (US); Vladimir Nikitin, Campbell, CA (US)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 57 days.

(21) Appl. No.: 13/332,305

(22) Filed: Dec. 20, 2011

(65) Prior Publication Data
US 2013/0154036 A1 Jun. 20, 2013

(51) Int. Cl.
*H01L 43/08* (2006.01)
(52) U.S. Cl.
USPC ............ 257/421; 257/E43.004; 257/E21.002; 257/E29.323; 257/E27.005; 257/E21.665; 257/295; 438/257; 438/3; 428/826; 365/158; 365/145; 369/126

(58) Field of Classification Search
USPC ........... 365/173, 158; 438/257; 257/421, 295; 428/811
See application file for complete search history.

(56) References Cited

U.S. PATENT DOCUMENTS

| | | | |
|---|---|---|---|
| 2008/0230819 A1* | 9/2008 | Nguyen et al. | 257/295 |
| 2008/0316657 A1 | 12/2008 | Zhang et al. | |
| 2009/0251949 A1* | 10/2009 | Xia | 365/158 |
| 2011/0094875 A1 | 4/2011 | Djayaprawira et al. | |
| 2011/0140217 A1* | 6/2011 | Nguyen et al. | 257/421 |
| 2011/0268992 A1 | 11/2011 | Zhang et al. | |
| 2012/0313191 A1* | 12/2012 | Whig et al. | 257/421 |

* cited by examiner

*Primary Examiner* — Jerome Jackson, Jr.
*Assistant Examiner* — Bo Fan
(74) *Attorney, Agent, or Firm* — Convergent Law Group LLP

(57) ABSTRACT

A method and system provide a magnetic junction usable in a magnetic device. The magnetic junction includes a pinned layer, a nonmagnetic spacer layer, a free layer, at least one insulating layer, and at least one magnetic insertion layer adjoining the at least one insulating layer. The nonmagnetic spacer layer is between the pinned layer and the free layer. The at least one insulating layer is adjacent to at least one of the free layer and the pinned layer. The at least one magnetic insertion layer adjoins the at least one insulating layer. In some aspects, the insulating layer(s) include at least one of magnesium oxide, aluminum oxide, tantalum oxide, ruthenium oxide, titanium oxide, and nickel oxide The magnetic junction is configured such that the free layer is switchable between a plurality of stable magnetic states when a write current is passed through the magnetic junction.

34 Claims, 7 Drawing Sheets

US 8,710,602 B2

METHOD AND SYSTEM FOR PROVIDING MAGNETIC JUNCTIONS HAVING IMPROVED CHARACTERISTICS

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10. Thus, by reading the tunneling magnetoresistance (TMR) of the conventional MTJ 10 the state of the conventional MTJ can be determined, Although the conventional MTJ 10 may be written using spin transfer, read by sensing the TMR of the junction, and used in an STT-RAM, there are drawbacks. For example, the signal from the conventional MTJ 10 may be lower than desired. For conventional MTJs 10 having the magnetizations 17 and 21 oriented perpendicular, the TMR may be lower than a conventional MTJ 10 having its magnetization in-plane. As a result, the signal from the conventional MTJ 10 may be even lower than desired. For conventional MTJs 10 having the magnetizations oriented perpendicular to plane, the perpendicular anisotropy o the conventional MTJ 10 may be lower than desired. Thus, the conventional MTJ 10 oriented perpendicular, the thermal stability may be lower than desired. The conventional MTJ 10 may also exhibit higher damping than desired. Thus, performance of a memory using the conventional MTJ 10 is still desired to be improved.

Accordingly, what is needed is a method and system that may improve the performance of the spin transfer torque based memories. The method and system described herein address such a need.

BRIEF SUMMARY OF THE INVENTION

A method and system provide a magnetic junction usable in a magnetic device. The magnetic junction includes a pinned layer, a nonmagnetic spacer layer, a free layer, at least one insulating layer, and at least one magnetic insertion layer adjoining the at least one insulating layer. The nonmagnetic spacer layer is between the pinned layer and the free layer. The at least one insulating layer is adjacent to at least one of the free layer and the pinned layer. The at least one magnetic insertion layer adjoins the at least one insulating layer. The magnetic junction is configured such that the free layer is switchable between a plurality of stable magnetic states when a write current is passed through the magnetic junction.

DETAILED DESCRIPTION OF THE INVENTION

Figure 1:
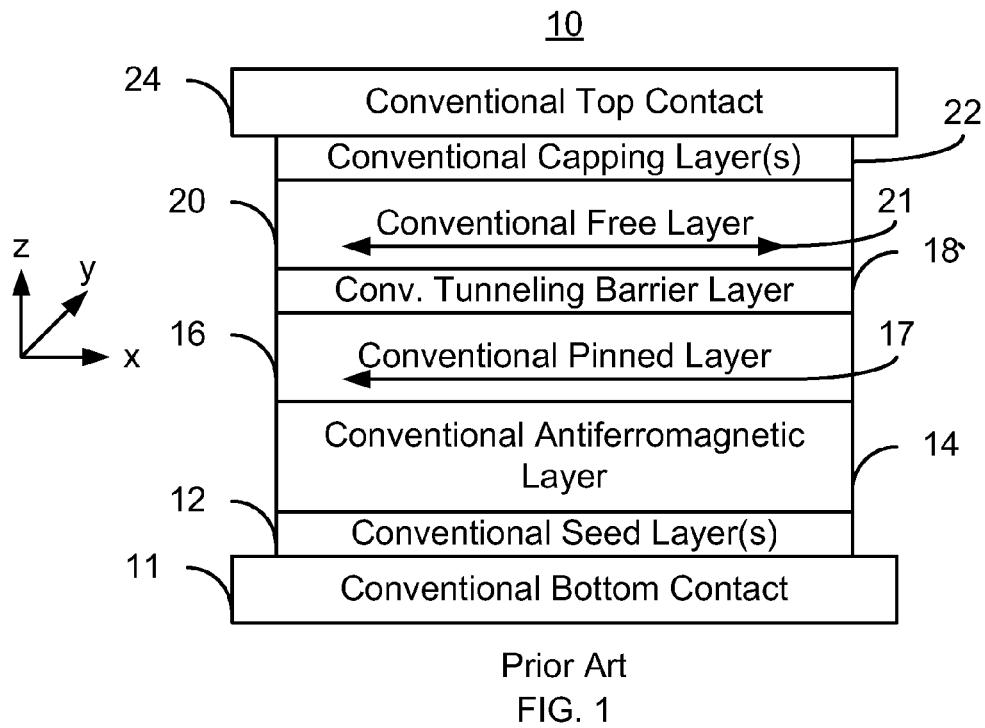
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. The magnetic junction includes a pinned layer, a nonmagnetic spacer layer, a free layer, at least one MgO layer, and at least one magnetic insertion layer adjoining the at least one MgO layer. The nonmagnetic spacer layer is between the pinned layer and the free layer. The at least one MgO layer is adjacent to at least one of the free layer and the pinned layer. The at least one magnetic insertion layer adjoins the at least one MgO layer. The magnetic junction is configured such that the free layer is switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
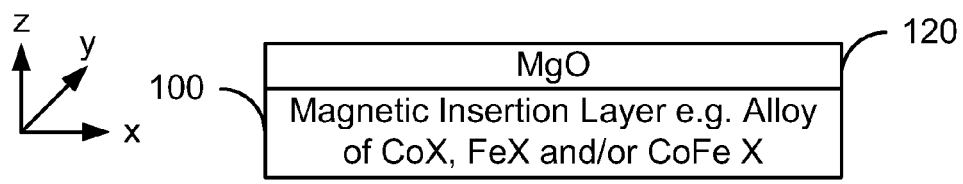
FIG. 2 depicts an exemplary embodiment of a magnetic insertion layer adjoining an MgO layer.

FIG. 2 depicts an exemplary embodiment of a magnetic insertion layer 100 usable in a magnetic device, for example a magnetic tunneling junction (MTJ), spin valve, or ballistic magnetoresistance structure, or some combination thereof. The magnetic device in which the magnetic substructure 100 is used may be used in a variety of applications. For example, the magnetic device, and thus the magnetic substructure, may be used in a magnetic memory such as an STT-RAM. For clarity, FIG. 2 is not to scale. The magnetic insertion layer 100 is shown as adjoining an MgO layer 120. In the embodiment shown, the MgO layer 120 is on top of the magnetic insertion layer 100. However, in another embodiment, the magnetic insertion layer 100 may be grown on the MgO layer 120. Thus, no particular relationship to the substrate should be assumed for the magnetic insertion layer 100 and the MgO layer 120. Further, the layer 120 is described as being an MgO layer. However, in other embodiments, the layer 120 may include at least one of aluminum oxide, tantalum oxide, ruthenium oxide, titanium oxide, and nickel oxide.

The magnetic insertion layer 100 shown in FIG. 2 is at least one magnetic layer that includes CoX, FeX and/or CoFeX, where X is selected form a group of materials includes B, Ge, Hf, Zr, Ti, Ta, and Tb. In some embodiments, the magnetic insertion layer 10 consists of CoX, FeX and/or CoFeX. In some embodiments, the magnetic insertion layer 100 is formed of CoFeB. The magnetic insertion layer 100 adjoins the MgO layer 120. The MgO layer 120 might be crystalline in structure and may have a preferred texture. In some embodiments, the magnetic insertion layer 100 is at least 3 Angstroms and not more than 2 nanometers. In some embodiments, the magnetic insertion layer 100, though made of magnetic materials is desired to be nonmagnetic. In such embodiments, the magnetic insertion layer 100 may be desired to be not more than five nanometers thick or an analogous thickness for the material(s) used. At such low thicknesses, the magnetic insertion layer 100 is magnetically dead. Thus, magnetic material(s), such as CoFeB, may be used for the magnetic insertion layer even though the magnetic insertion layer 100 is nonmagnetic. In other embodiments, greater thicknesses may be used if a ferromagnetic insertion layer 100 is desired or acceptable. When used in a magnetic junction, the magnetic insertion layer 100 resides external to the magnetoresistive region of the magnetic junction. For example, in a MTJ, the magnetic insertion layer 100 would not reside between the free layer and the tunneling barrier layer or between the tunneling barrier layer and the pinned layer. Similarly, for a dual MTJ, the magnetic insertion layer 100 would not reside between the free layer and either of the two tunneling barrier layers or between the two pinned layers and the two tunneling barrier layers. Thus, the magnetic insertion layer 100 can be considered to reside external to the sensing portion of the magnetic junction with which it is used.

The magnetic insertion layer 100 may be used to tailor the properties of the magnetic junction in which the magnetic insertion layer 100 is used. For example, the magnetic insertion layer 100 in combination with the MgO layer 120 shown in FIG. 3 may result in an MgO layer 120 having a lower resistance area (RA). Use of the magnetic insertion layer 100 may affect other layers in the magnetic junction in which the magnetic insertion layer 100 is used. For example, the RA of the junction, including tunneling barrier layer(s) (not shown in FIG. 2) between the pinned layer(s) and the free layer, may be reduced. In some embodiments, the RA of the combination of the MgO layer 120, the magnetic insertion layer 100, and the junction (not shown) may be reduced by a factor of two or more. In some such embodiments the junction RA may be reduced by a factor of ten or more. This reduction in RA may improve the TMR of the magnetic junction. In some embodiments, the perpendicular anisotropy of other magnetic layers (not shown) in a magnetic junction using the magnetic insertion layer 100 may be enhanced. Thus, spin transfer writing may be improved. The magnetic junction may also be more thermally stable with the magnetization perpendicular to plane. Thus, performance of a magnetic junction that utilizes the magnetic insertion layer 100 may be improved.

As a result, the properties of a magnetic device in which the magnetic insertion layer 100 is used may also be configured as desired. For example, the TMR of the magnetic device in which the magnetic substructure 100 is used may be enhanced due to improved crystallization of the free layer and lattice match with the tunneling junction, especially for a tunneling junction with two barriers. The switching characteristics, such as the WER and data rate, may be enhanced in a magnetic device in which the magnetic substructure 100 is used.

Figure 3:
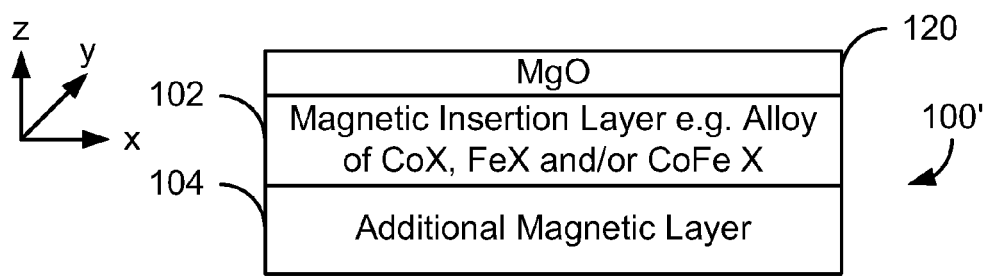
FIG. 3 depicts another exemplary embodiment of a magnetic insertion layer adjoining an MgO layer

FIG. 3 depicts an exemplary embodiment of a magnetic insertion layer 100' usable in a magnetic device, for example a MTJ, spin valve, or ballistic magnetoresistance structure, or some combination thereof. The magnetic device in which the magnetic insertion layer 100' is used may be used in a variety of applications. For example, the magnetic junction, and thus the magnetic insertion layer, may be used in a magnetic memory such as an STT-RAM. For clarity, FIG. 3 is not to scale. The magnetic insertion layer 100' is analogous to the magnetic insertion layer 100. Similarly, the magnetic insertion layer 100' is shown with MgO layer 120'. Consequently, analogous components are labeled similarly. The magnetic insertion layer 100' is shown as adjoining an MgO layer 120'. In the embodiment shown, the MgO layer 120' is on top of the magnetic insertion layer 100. However, in another embodiment, the magnetic insertion layer 100' may be grown on the MgO layer 120'. Thus, no particular relationship to the substrate should be assumed for the magnetic insertion layer 100' and the MgO layer 120'. In the embodiment shown, the layer 120' is described as an MgO layer. However, in other embodiments, the layer 120' may include at least one of aluminum oxide, tantalum oxide, ruthenium oxide, titanium oxide, and nickel oxide.

The magnetic insertion layer 100' is used in a magnetic junction in a similar manner as the magnetic insertion layer 100. When used in a magnetic junction, therefore, the magnetic insertion layer 100' resides external to the magnetoresistive region of the magnetic junction. Stated differently, the magnetic insertion layer 100' can be considered to reside external to the sensing portion of the magnetic junction with which it is used.

The magnetic insertion layer 100' shown in FIG. 3 is a bilayer that includes a magnetic layer 102 and an additional magnetic layer 104. The magnetic layer 102 includes CoX, FeX and/or CoFeX, where X is selected form a group of materials includes B, Ge, Hf, Zr, Ti, Ta and, Tb. In some embodiments, the magnetic layer 102 consists of CoX, FeX and/or CoFeX. In some embodiments, the magnetic layer 102 is formed of CoFeB. Thus, the magnetic layer 102 may be considered to be analogous to one embodiment of the magnetic insertion layer 100. The magnetic insertion layer 100' adjoins the MgO layer 120'. In the embodiment shown, the magnetic layer 102 adjoins the MgO layer 120' and is between the MgO layer 120' and the additional magnetic layer 104. However, in other embodiments, the additional magnetic layer 104 may be between the MgO layer 120 and the magnetic layer 102. The additional magnetic layer 104 may include Co and/or Fe. In some embodiments, the magnetic layer 104 may consist of and Fe layer or may consist of a Co layer.

In some embodiments, the magnetic insertion layer 100' is at least 3 Angstroms and not more than 2 nanometers. In some embodiments, the magnetic insertion layer 100', though made of magnetic materials is desired to be nonmagnetic. In such embodiments, the magnetic insertion layer 100' may be desired to be not more than five nanometers thick or an analogous thickness for the material(s) used. At such low thicknesses, the magnetic insertion layer 100' is magnetically dead. Thus, magnetic material(s), such as CoFeB, may be used for the magnetic layer 102 and magnetic material(s) such as Co or Fe may be used for the additional magnetic layer 104 even though the magnetic insertion layer 100' is nonmagnetic. In other embodiments, greater thicknesses may be used if a magnetic insertion layer 100' is desired or acceptable.

The magnetic insertion layer 100' may be used to tailor the properties of the magnetic junction in which the magnetic insertion layer 100' is used. The magnetic insertion layer 100' may thus share the benefits of the magnetic insertion layer 100. For example, a magnetic junction in which the magnetic insertion layer 100' is employed may enjoy a reduced RA, improved TMR, higher perpendicular anisotropy, higher thermal stability, and/or other benefits. Thus, performance of a magnetic junction that utilizes the magnetic insertion layer 100' may be improved.

Figure 4:
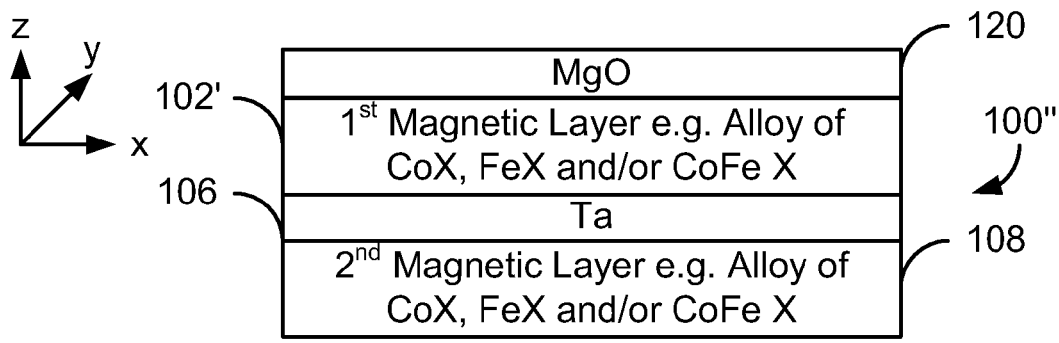
FIG. 4 depicts exemplary embodiment of a magnetic insertion layer adjoining an MgO layer

FIG. 4 depicts an exemplary embodiment of a magnetic insertion layer 100" usable in a magnetic device, for example a MTJ, spin valve, or ballistic magnetoresistance structure, or some combination thereof. The magnetic device in which the magnetic insertion layer 100" is used may be used in a variety of applications. For example, the magnetic junction, and thus the magnetic insertion layer, may be used in a magnetic memory such as an STT-RAM. For clarity, FIG. 4 is not to scale. The magnetic insertion layer 100" is analogous to the magnetic insertion layers 100 and 100'. Similarly, the magnetic insertion layer 100" is shown with MgO layer 120". Consequently, analogous components are labeled similarly. The magnetic insertion layer 100" is shown as adjoining an MgO layer 120". In the embodiment shown, the MgO layer 120" is on top of the magnetic insertion layer 100". However, in another embodiment, the magnetic insertion layer 100" may be grown on the MgO layer 120". Thus, no particular relationship to the substrate should be assumed for the magnetic insertion layer 100" and the MgO layer 120". In the embodiment shown, the layer 120" is described as an MgO layer. However, in other embodiments, the layer 120" may include at least one of aluminum oxide, tantalum oxide, ruthenium oxide, titanium oxide, and nickel oxide.

The magnetic insertion layer 100" is used in a magnetic junction in a similar manner as the magnetic insertion layers 100 and 100'. When used in a magnetic junction, therefore, the magnetic insertion layer 100" resides external to the magnetoresistive region of the magnetic junction. Stated differently, the magnetic insertion layer 100" can be considered to reside external to the sensing portion of the magnetic junction with which it is used.

The magnetic insertion layer 100" shown in FIG. 4 is a multilayer that includes at least a first magnetic layer 102', a nonmagnetic layer 106, and a second magnetic layer 108. In some embodiments, additional magnetic layers (not shown) may be interleaved with additional nonmagnetic layers (not shown). The first magnetic layer 102' includes CoX, FeX and/or CoFeX, where X is selected form a group of materials includes B, Ge, Hf, Zr, Ti, Ta and, Tb. In some embodiments, the first magnetic layer 102' consists of CoX, FeX and/or CoFeX. In some such embodiments, the first magnetic layer 102' is formed of CoFeB. The second magnetic layer 108 includes CoY, FeY and/or CoFeY, where Y is selected form a group of materials includes B, Ge, Hf, Zr, Ti, Ta and, Tb. In some embodiments, the second magnetic layer 108 consists of CoY, FeY and/or CoFeY. In some embodiments, second magnetic layer 108 is formed of CoFeB. Thus, the first magnetic layer 102' and the second magnetic layer 104 may each be considered to be analogous to one embodiment of the magnetic insertion layer 100. The magnetic insertion layer 100" adjoins the MgO layer 120". In the embodiment shown, the magnetic layer 102' adjoins the MgO layer 120' and is between the MgO layer 120' and the second magnetic layer 108. However, in other embodiments, the second magnetic layer 108 may be between the MgO layer 120 and the magnetic layer 102. The nonmagnetic layer 106 is shown as consisting of Ta. However, in other embodiments, other or additional nonmagnetic materials may be used. For example, the nonmagnetic layer may include one or more of Ru, Cr, Ti, W, Ru, V, Hf, Zr and Ta. In some embodiments, the nonmagnetic layer 106 may consist of at least one of Ru, Cr, Ti, W, Ru, V, Hf, Zr and Ta.

In some embodiments, the magnetic insertion layer 100" is at least 3 Angstroms and not more than 2 nanometers. In some embodiments, the magnetic insertion layer 100', though made of magnetic materials is desired to be nonmagnetic. In such embodiments, the each of the magnetic layers 102' and 108 in magnetic insertion layer 100" may be desired to be not more than five nanometers thick or an analogous thickness for the material(s) used. At such low thicknesses, the magnetic layers 102' and 108 are each magnetically dead. Thus, magnetic material(s), such as CoFeB, may be used for the magnetic layers 102' and 108 even though the magnetic insertion layer 100" is nonmagnetic. In other embodiments, greater thicknesses may be used for one or more of the magnetic layers 102' and 108 if a magnetic insertion layer 100' is desired or acceptable.

The magnetic insertion layer 100" may be used to tailor the properties of the magnetic junction in which the magnetic insertion layer 100" is used. The magnetic insertion layer 100" may thus share the benefits of the magnetic insertion layers 100 and/or 100'. For example, a magnetic junction in which the magnetic insertion layer 100" is employed may enjoy a reduced RA, improved TMR, higher perpendicular anisotropy, higher thermal stability, and/or other benefits. Thus, performance of a magnetic junction that utilizes the magnetic insertion layer 100" may be improved.

Figure 5:
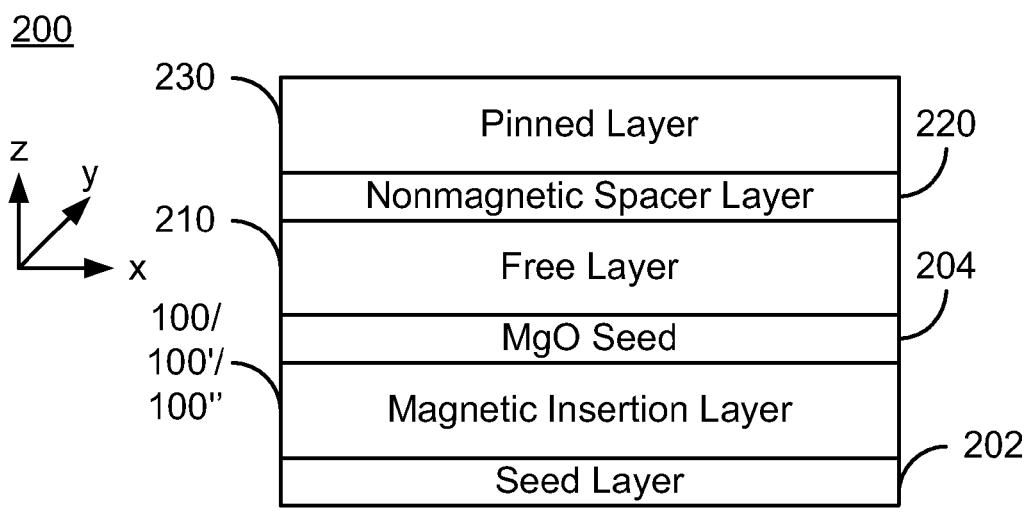
FIG. 5 depicts an exemplary embodiment of a magnetic junction using a magnetic insertion layer and switchable via spin transfer.

FIG. 5 depicts an exemplary embodiment of a magnetic junction 200 including a magnetic insertion layer such as the 100, 100', and/or 100". For clarity, FIG. 5 is not to scale. The magnetic junction 200 includes an MgO seed layer 204, a free layer 210, a nonmagnetic spacer layer 220, and a pinned layer 230. Although layers 210, 220, and 230 are shown with a particular orientation, this orientation may vary in other embodiments. For example, the pinned layer 230 may be closer to the bottom (closets to a substrate that is not shown) of the magnetic junction 200. Also shown is optional seed layer 202. A pinning layer (not shown) and a capping layer (not shown) may also be used. In general, the pinning layer would be used if the magnetic moment of the pinned layer 230 is in plane but would not be used if the magnetic moment of the pinned layer 230 is perpendicular to plane. Such a pinning layer would be may be used to fix the magnetization (not shown) of the pinned layer 230. In some embodiments, the pinning layer may be an AFM layer or multilayer that pins the magnetization (not shown) of the pinned layer 230 by an exchange-bias interaction. The magnetic junction 200 is also configured to allow the free layer 210 to be switched between stable magnetic states when a write current is passed through the magnetic junction 200. Thus, the free layer 210 is switchable utilizing spin transfer torque.

The nonmagnetic spacer layer 220 may be a tunneling barrier layer, conductor, or other structure for which magnetoresistance is exhibited between the free layer 210 and the pinned layer 230. In some embodiments, the nonmagnetic spacer layer 220 is a crystalline MgO tunneling barrier layer.

In such embodiments, the MgO seed layer 204 may be employed to improve the TMR and other characteristics of the magnetic junction 200. It is hypothesized that the presence of the MgO seed layer improves the crystal structure of the tunneling barrier layer 220.

Although depicted as simple layers, the free layer 210 and/or the pinned layer 230 may include multiple layers. For example, the free layer 210 and/or the pinned layer 230 may be a SAF including magnetic layers antiferromagnetically or ferromagnetically coupled through thin layers, such as Ru. In such a SAF, multiple magnetic layers interleaved with thin layer(s) of Ru or other material may be used. The free layer 210 and/or the pinned layer 230 may also be another multilayer. Although a magnetization is not depicted in FIG. 5, the free layer 210 and/or the pinned layer 230 may each have a perpendicular anisotropy energy that exceeds the out-of-plane demagnetization energy. Thus, the free layer 210 and/or the pinned layer 230 may each have its magnetic moment oriented perpendicular to plane. In other embodiments, the magnetic moment of the free layer 210 and/or the pinned layer 230 are each in-plane. Other orientations of the magnetic moments of the free layer 210 and/or the pinned layer 230 are possible.

Because the magnetic insertion layer 100, 100', and/or 100" is used, the magnetic junction 200 may share the benefits of the magnetic insertion layer 100, 100', and/or 100". In particular, the magnetic junction 200 may be more thermally stable when the moments are oriented perpendicular, may have a higher perpendicular anisotropy for the layers 210 and/or 230, may lower RA and/or may have improved TMR. As discussed above, the magnetic insertion layers 100, 100', and/or 100" may reduce the RA of an adjacent MgO layer, such as the MgO seed layer 204. The contribution of the parasitic resistance of the MgO seed layer 204 to the total resistance of the magnetic junction 200 may be reduced. The TMR due to the magnetic orientations of the free layer 210 and the pinned layer 230 may thus be a larger fraction of the total resistance of the magnetic junction 100. As such, the TMR of the magnetic junction is effectively enhanced. Further, the RA of the MgO tunneling barrier layer 220 may be reduced by the presence of the improved MgO seed layer 204 and, therefore, the magnetic insertion layer 100/100'/100". Thus, the RA of the magnetic junction 200 may be further reduced. Thus, the performance of the magnetic junction 200 may improve.

Figure 6:
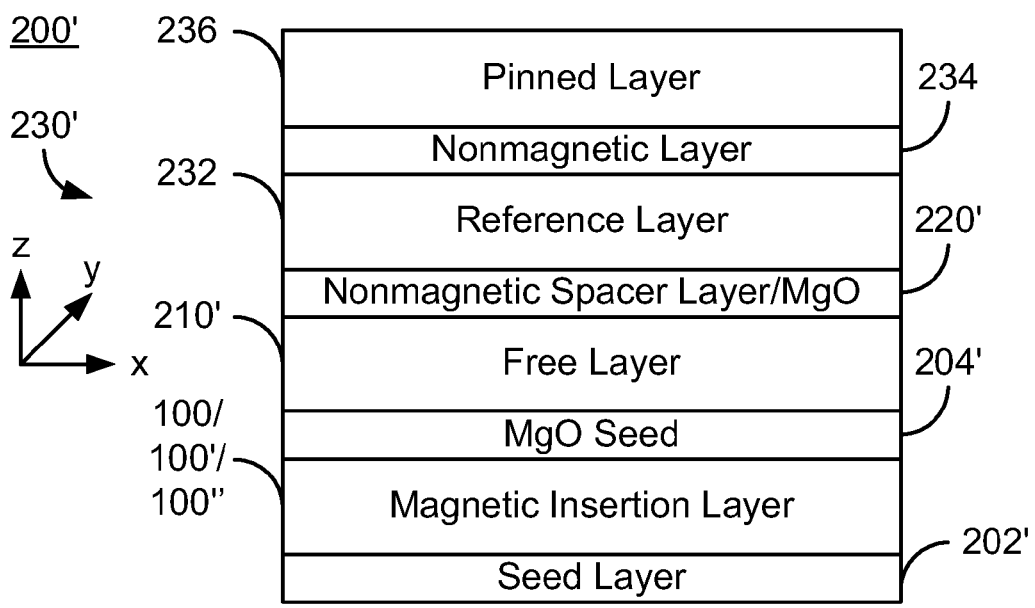
FIG. 6 depicts another exemplary embodiment of a magnetic junction using a magnetic insertion layer and switchable via spin transfer

FIG. 6 depicts an exemplary embodiment of a magnetic junction 200' including the magnetic insertion layer 100/100'/100". For clarity, FIG. 6 is not to scale. The magnetic junction 200' is analogous to the magnetic junction 200. Thus, analogous layers are labeled similarly. The magnetic junction 200' includes a free layer 210', a nonmagnetic spacer layer 220', and a pinned layer 230' analogous to the layers 210, 220, and 230, respectively. Although layers 210', 220', and 230' are shown with a particular orientation, this orientation may vary in other embodiments. Also shown are MgO seed layer 204 and the magnetic insertion layer 100/100'/100". In some embodiments, an optional pinning layer (not sown) and/or optional capping layer (not shown) may be included. The magnetic junction 200' is also configured to allow the free layer 210' to be switched between stable magnetic states when a write current is passed through the magnetic junction 200'. Thus, the free layer 210' is switchable utilizing spin transfer torque.

The nonmagnetic spacer layer 220' may be a tunneling barrier layer, conductor, or other structure for which magnetoresistance is exhibited between the free layer 210' and the pinned layer 230'. In some embodiments, the nonmagnetic spacer layer 220' is a crystalline MgO tunneling barrier layer. In such embodiments, the MgO seed layer 204' may be employed to improve the TMR and other characteristics of the magnetic junction 200'. It is hypothesized that the presence of the MgO seed layer 204' improves the crystal structure (structure and/or texture) of the tunneling barrier layer 220'.

Although depicted as a simple layer, the free layer 210' may include multiple layers, as described above. The pinned layer 230' is expressly depicted as including a reference layer 232, a nonmagnetic layer 234, and a pinned layer 236. Thus, the pinned layer 230' is a SAF in this embodiment. Although a magnetization is not depicted in FIG. 6, the free layer 210' and/or the pinned layer 230' may each have a perpendicular anisotropy energy that exceeds the out-of-plane demagnetization energy. Thus, the free layer 210' and/or the pinned layer 230' may each have its magnetic moment oriented perpendicular to plane. In other embodiments, the magnetic moment of the free layer 210' and/or the pinned layer 230' are each in-plane. Other orientations of the magnetic moments of the free layer 210' and/or the pinned layer 230' are possible.

Because the magnetic insertion layer 100, 100', and/or 100" is used, the magnetic junction 200' may share the benefits of the magnetic insertion layer 100, 100', and/or 100". In particular, the magnetic junction 200' may be more thermally stable when the moments are oriented perpendicular, may have a higher perpendicular anisotropy for the layers 210' and/or 230', may lower RA and/or may have improved TMR. Thus, the performance of the magnetic junction 200' may improve.

Figure 7:
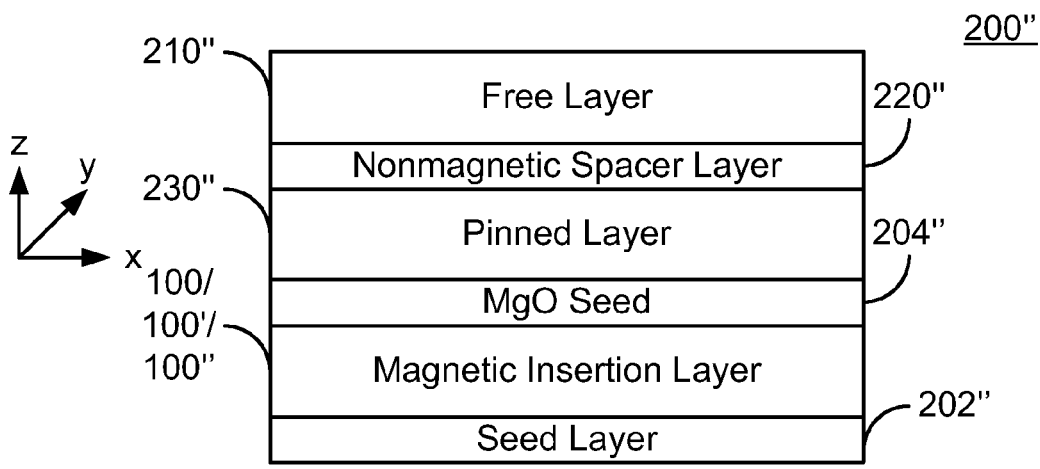
FIG. 7 depicts another exemplary embodiment of a magnetic junction using a magnetic insertion layer and switchable via spin transfer.

FIG. 7 depicts an exemplary embodiment of a magnetic junction 200" including the magnetic insertion layer 100/100'/100". For clarity, FIG. 7 is not to scale. The magnetic junction 200" is analogous to the magnetic junctions 200 and/or 200'. Thus, analogous layers are labeled similarly. The magnetic junction 200" includes a free layer 210", a nonmagnetic spacer layer 220", and a pinned layer 230" analogous to the layers 210/210', 220/220', and 230/230', respectively. Although layers 210", 220", and 230" are shown with a particular orientation, this orientation may vary in other embodiments. Also shown are MgO seed layer 204" and the magnetic insertion layer 100/100'/100". In some embodiments, an optional pinning layer (not sown) and/or optional capping layer (not shown) may be included. The magnetic junction 200" is also configured to allow the free layer 210" to be switched between stable magnetic states when a write current is passed through the magnetic junction 200". Thus, the free layer 210" is switchable utilizing spin transfer torque.

The nonmagnetic spacer layer 220" may be a tunneling barrier layer, conductor, or other structure for which magnetoresistance is exhibited between the free layer 210" and the pinned layer 230". In some embodiments, the nonmagnetic spacer layer 220" is a crystalline MgO tunneling barrier layer. In such embodiments, the MgO seed layer 204" may be employed to improve the TMR and other characteristics of the magnetic junction 200". It is hypothesized that the presence of the MgO seed layer 204" improves the crystal structure (structure and/or texture) of the tunneling barrier layer 220".

Although depicted as simple layers, the free layer 210" and/or pinned layer 230" may include multiple layers, as described above. Although a magnetization is not depicted in FIG. 7, the free layer 210" and/or the pinned layer 230" may each have a perpendicular anisotropy energy that exceeds the out-of-plane demagnetization energy. Thus, the free layer 210" and/or the pinned layer 230" may each have its magnetic moment oriented perpendicular to plane. In other embodiments, the magnetic moment of the free layer 210" and/or the pinned layer 230" are each in-plane. Other orientations of the magnetic moments of the free layer 210" and/or the pinned layer 230" are possible.

Because the magnetic insertion layer 100, 100', and/or 100" is used, the magnetic junction 200" may share the benefits of the magnetic insertion layer 100, 100', and/or 100". In particular, the magnetic junction 200" may be more thermally stable when the moments are oriented perpendicular, may have a higher perpendicular anisotropy for the layers 210" and/or 230", may lower RA and/or may have improved TMR. Thus, the performance of the magnetic junction 200" may improve.

Figure 8:
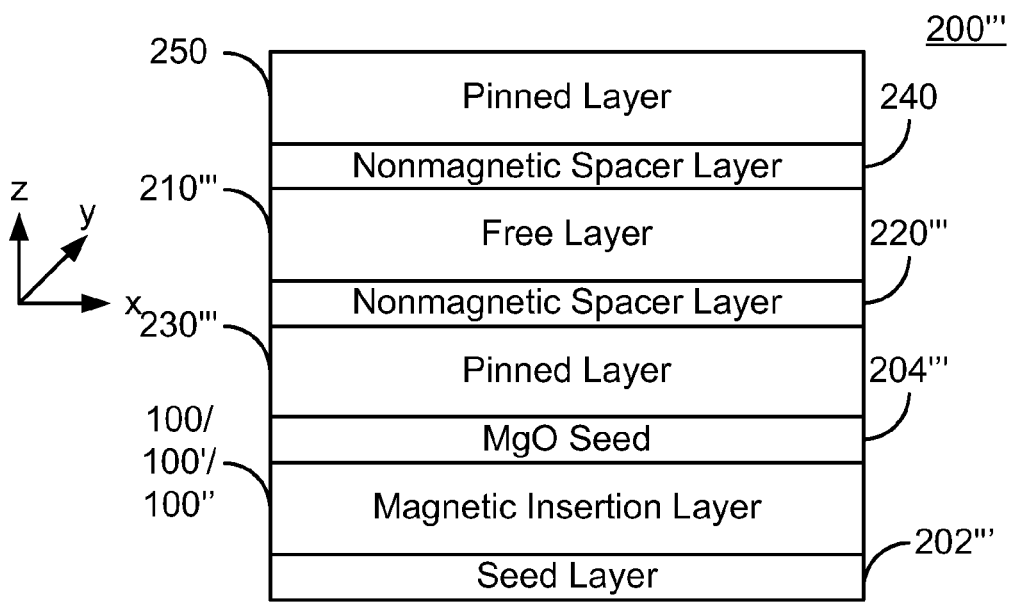
FIG. 8 depicts another exemplary embodiment of a magnetic junction using a magnetic insertion layer and switchable via spin transfer.

FIG. 8 depicts an exemplary embodiment of a magnetic junction 200''' including the magnetic insertion layer 100/100'/100". For clarity, FIG. 8 is not to scale. The magnetic junction 200''' is analogous to the magnetic junctions 200, 200' and/or 200". Thus, analogous layers are labeled similarly. The magnetic junction 200''' includes a free layer 210''', a nonmagnetic spacer layer 220''', and a pinned layer 230''' analogous to the layers 210/210'/210", 220/220'/220", and 230/230'/230", respectively. Although layers 210''', 220''', and 230''' are shown with a particular orientation, this orientation may vary in other embodiments. Also shown are MgO seed layer 204''' and the magnetic insertion layer 100/100'/100". In some embodiments, an optional pinning layer (not sown) and/or optional capping layer (not shown) may be included. The magnetic junction 200''' is also configured to allow the free layer 210''' to be switched between stable magnetic states when a write current is passed through the magnetic junction 200'''. Thus, the free layer 210''' is switchable utilizing spin transfer torque.

The nonmagnetic spacer layer 220''' may be a tunneling barrier layer, conductor, or other structure for which magnetoresistance is exhibited between the free layer 210''' and the pinned layer 230'''. In some embodiments, the nonmagnetic spacer layer 220''' is a crystalline MgO tunneling barrier layer. In such embodiments, the MgO seed layer 204''' may be employed to improve the TMR and other characteristics of the magnetic junction 200'''. It is hypothesized that the presence of the MgO seed layer 204''' improves the crystal structure (structure and/or texture) of the tunneling barrier layer 220'''.

In addition, the magnetic junction 200''' is a dual structure. Thus, the magnetic junction 200''' also includes an additional nonmagnetic spacer layer 240 and an additional pinned layer 250. The nonmagnetic spacer layer 240 may be analogous to the nonmagnetic spacer layer 220'''. Thus, the nonmagnetic spacer layer 240 may be a crystalline MgO tunneling barrier layer. In other embodiments, the nonmagnetic spacer layer 240 may differ from the layer 220'''. Similarly, the pinned layer 250 may be analogous to the pinned layer 230".

Although depicted as simple layers, the free layer 210''' and/or pinned layers 230''' and 250 may include multiple layers, as described above. Although a magnetization is not depicted in FIG. 7, the free layer 210''' and/or the pinned layers 230''' and 250 may each have a perpendicular anisotropy energy that exceeds the out-of-plane demagnetization energy. Thus, the free layer 210''' and/or the pinned layers 230''' and 250 may each have its magnetic moment oriented perpendicular to plane. In other embodiments, the magnetic moment of the free layer 210''' and/or the pinned layer 230''' are each in-plane. Other orientations of the magnetic moments of the free layer 210''' and/or the pinned layer 230''' are possible.

Because the magnetic insertion layer 100, 100', and/or 100" is used, the magnetic junction 200''' may share the benefits of the magnetic insertion layer 100, 100', and/or 100". In particular, the magnetic junction 200''' may be more thermally stable when the moments are oriented perpendicular, may have a higher perpendicular anisotropy for the layers 210''' and/or 230''', may lower RA and/or may have improved TMR. Thus, the performance of the magnetic junction 200''' may improve.

Figure 9:
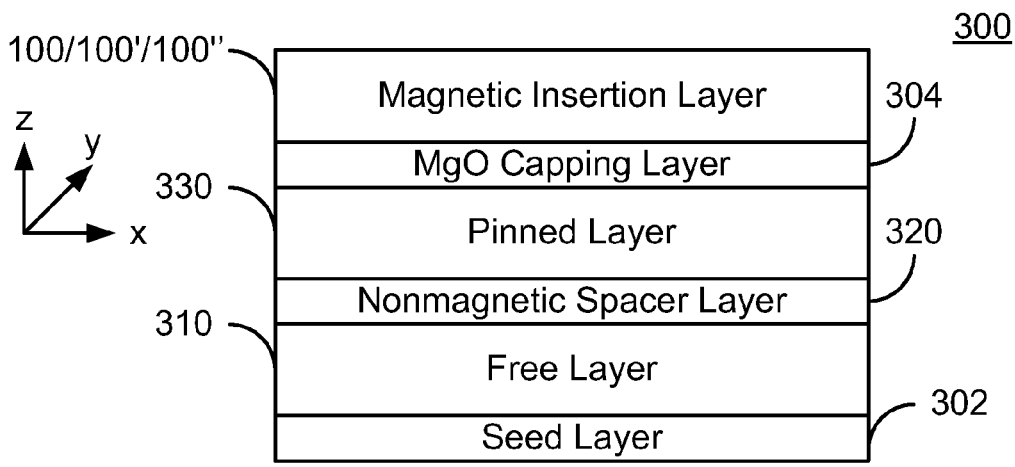
FIG. 9 depicts another exemplary embodiment of a magnetic junction using a magnetic insertion layer and switchable via spin transfer.

FIG. 9 depicts an exemplary embodiment of a magnetic junction 300 including a magnetic insertion layer such as the 100, 100', and/or 100". For clarity, FIG. 9 is not to scale. The magnetic junction 300 includes a free layer 310, a nonmagnetic spacer layer 320, a pinned layer 330, and an MgO capping layer 304. Although layers 310, 320, and 330 are shown with a particular orientation, this orientation may vary in other embodiments. For example, the pinned layer 330 may be closer to the bottom (closets to a substrate that is not shown) of the magnetic junction 300. Also shown is optional seed layer 302. A pinning layer (not shown) and an MgO seed layer (not shown) may also be used. In general, the pinning layer would be used if the magnetic moment of the pinned layer 330 is in plane but would not be used if the magnetic moment of the pinned layer 330 is perpendicular to plane. Such a pinning layer would be may be used to fix the magnetization (not shown) of the pinned layer 330. In some embodiments, the pinning layer may be an AFM layer or multilayer that pins the magnetization (not shown) of the pinned layer 330 by an exchange-bias interaction. The magnetic junction 300 is also configured to allow the free layer 310 to be switched between stable magnetic states when a write current is passed through the magnetic junction 300. Thus, the free layer 310 is switchable utilizing spin transfer torque.

The nonmagnetic spacer layer 320 may be a tunneling barrier layer, conductor, or other structure for which magnetoresistance is exhibited between the free layer 310 and the pinned layer 330. In some embodiments, the nonmagnetic spacer layer 320 is a crystalline MgO tunneling barrier layer. In such embodiments, the MgO capping layer 304 may be employed to improve the TMR and other characteristics of the magnetic junction 300. It is hypothesized that the presence of the MgO capping layer 304 improves the crystal structure (structure and/or texture) of the tunneling barrier layer 320 because the crystalline MgO tunneling barrier layer 320 is sensitive to the surrounding structures which may affect, among other activities, deposition of layers and annealing of the magnetic junction 300

Although depicted as simple layers, the free layer 310 and/or the pinned layer 330 may include multiple layers. For example, the free layer 310 and/or the pinned layer 330 may be a SAF including magnetic layers antiferromagnetically or ferromagnetically coupled through thin layers, such as Ru. In such a SAF, multiple magnetic layers interleaved with thin layer(s) of Ru or other material may be used. The free layer 310 and/or the pinned layer 330 may also be another multilayer. Although a magnetization is not depicted in FIG. 9, the free layer 310 and/or the pinned layer 330 may each have a perpendicular anisotropy energy that exceeds the out-of-plane demagnetization energy. Thus, the free layer 310 and/or the pinned layer 330 may each have its magnetic moment oriented perpendicular to plane. In other embodiments, the magnetic moment of the free layer 310 and/or the pinned layer 330 are each in-plane. Other orientations of the magnetic moments of the free layer 310 and/or the pinned layer 330 are possible.

Because the magnetic insertion layer 100, 100', and/or 100" is used, the magnetic junction 300 may share the benefits of the magnetic insertion layer 100, 100', and/or 100". In particular, the magnetic junction 300 may be more thermally stable when the moments are oriented perpendicular, may have a higher perpendicular anisotropy for the layers 310 and/or 330, may lower RA and/or may have improved TMR. As discussed above, the magnetic insertion layers 100, 100', and/or 100" may reduce the RA of an adjacent MgO layer, such as the MgO seed layer 304. The reduction in the parasitic resistance of the MgO capping layer 304 may effectively enhance the TMR of the magnetic junction 300. Further, the RA of the MgO tunneling barrier layer 320 may be reduced by the presence of the improved MgO capping layer 304 and, therefore, the magnetic insertion layer 100/100'/100". Thus, the RA of the magnetic junction 300 may be further reduced. Thus, the performance of the magnetic junction 300 may improve.

Figure 10:
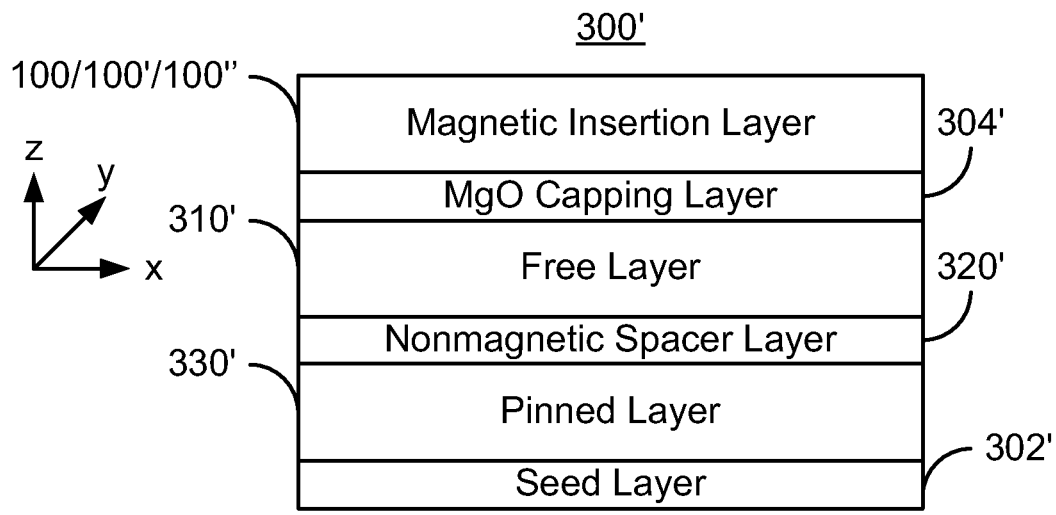
FIG. 10 depicts another exemplary embodiment of a magnetic junction using a magnetic insertion layer and switchable via spin transfer.

FIG. 10 depicts an exemplary embodiment of a magnetic junction 300' including the magnetic insertion layer 100/100'/100". For clarity, FIG. 10 is not to scale. The magnetic junction 300' is analogous to the magnetic junction 300. Thus, analogous layers are labeled similarly. The magnetic junction 300' includes a free layer 310', a nonmagnetic spacer layer 320', and a pinned layer 330' analogous to the layers 310, 320, and 330, respectively. Although layers 310', 320', and 330' are shown with a particular orientation, this orientation may vary in other embodiments. Also shown are MgO capping layer 304' and the magnetic insertion layer 100/100'/100". In some embodiments, an optional pinning layer (not shown) and/or optional MgO seed layer (not shown) may be included. The magnetic junction 300' is also configured to allow the free layer 310' to be switched between stable magnetic states when a write current is passed through the magnetic junction 300'. Thus, the free layer 310' is switchable utilizing spin transfer torque.

The nonmagnetic spacer layer 320' may be a tunneling barrier layer, conductor, or other structure for which magnetoresistance is exhibited between the free layer 310' and the pinned layer 330'. In some embodiments, the nonmagnetic spacer layer 320' is a crystalline MgO tunneling barrier layer. In such embodiments, the MgO capping layer 304' may be employed to improve the TMR and other characteristics of the magnetic junction 300'. It is hypothesized that the presence of the MgO capping layer 304' improves the crystal structure (structure and/or texture) of the tunneling barrier layer 320' because the crystalline MgO tunneling barrier layer 320' is sensitive to the surrounding structures which may affect, among other activities, deposition of layers and annealing of the magnetic junction 300'.

Although depicted as simple layers, the free layer 310' and/or pinned layer 330' may include multiple layers, as described above. Although a magnetization is not depicted in FIG. 10, the free layer 310' and/or the pinned layer 330' may each have a perpendicular anisotropy energy that exceeds the out-of-plane demagnetization energy. Thus, the free layer 310' and/or the pinned layer 330' may each have its magnetic moment oriented perpendicular to plane. In other embodiments, the magnetic moment of the free layer 310' and/or the pinned layer 330' are each in-plane. Other orientations of the magnetic moments of the free layer 310' and/or the pinned layer 330' are possible.

Because the magnetic insertion layer 100, 100', and/or 100" is used, the magnetic junction 300' may share the benefits of the magnetic insertion layer 100, 100', and/or 100". In particular, the magnetic junction 300' may be more thermally stable when the moments are oriented perpendicular, may have a higher perpendicular anisotropy for the layers 310' and/or 330', may lower RA and/or may have improved TMR. Thus, the performance of the magnetic junction 300' may improve.

Figure 11:
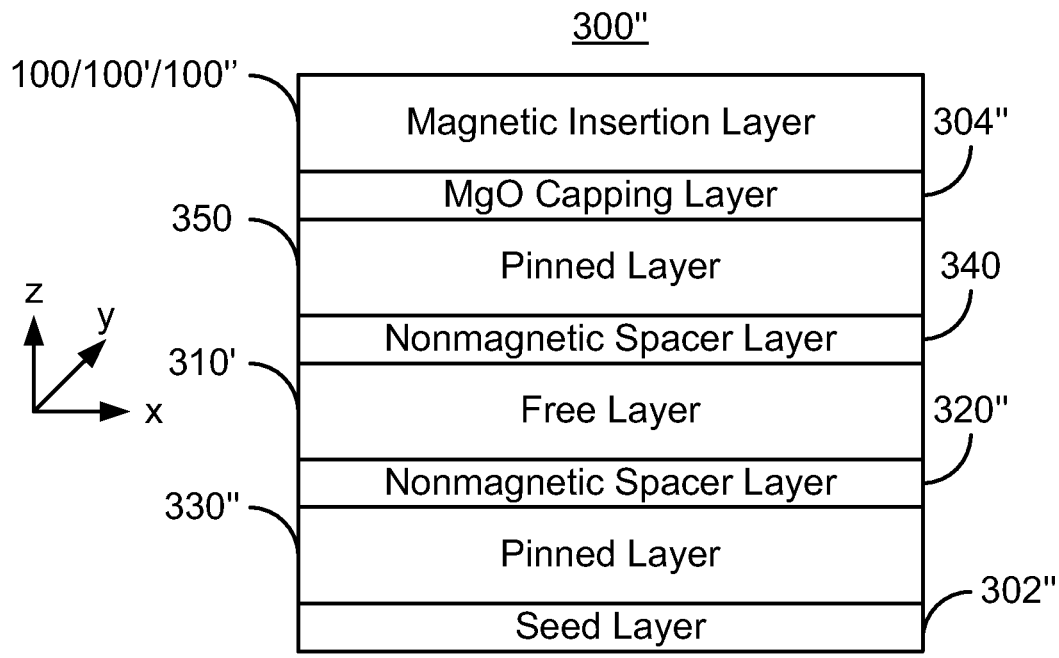
FIG. 11 depicts another exemplary embodiment of a magnetic junction using a magnetic insertion layer and switchable via spin transfer.

FIG. 11 depicts an exemplary embodiment of a magnetic junction 300" including the magnetic insertion layer 100/100'/100". For clarity, FIG. 11 is not to scale. The magnetic junction 300" is analogous to the magnetic junctions 300, and/or 300'. Thus, analogous layers are labeled similarly. The magnetic junction 300" includes a free layer 310", a nonmagnetic spacer layer 320", and a pinned layer 330" analogous to the layers 310/310', 320/320', and 330/330', respectively. Although layers 310", 320", and 330" are shown with a particular orientation, this orientation may vary in other embodiments. Also shown are MgO capping layer 304" and the magnetic insertion layer 100/100'/100". In some embodiments, an optional pinning layer (not shown) and/or optional MgO seed layer (not shown) may be included. The magnetic junction 300" is also configured to allow the free layer 310" to be switched between stable magnetic states when a write current is passed through the magnetic junction 300". Thus, the free layer 310" is switchable utilizing spin transfer torque.

The nonmagnetic spacer layer 320" may be a tunneling barrier layer, conductor, or other structure for which magnetoresistance is exhibited between the free layer 310" and the pinned layer 330". In some embodiments, the nonmagnetic spacer layer 320" is a crystalline MgO tunneling barrier layer. As discussed above, in such embodiments, the MgO capping layer 304" may be employed to improve the TMR and other characteristics of the magnetic junction 300".

In addition, the magnetic junction 300" is a dual structure. Thus, the magnetic junction 300" also includes an additional nonmagnetic spacer layer 340 and an additional pinned layer 350. The nonmagnetic spacer layer 340 may be analogous to the nonmagnetic spacer layer 320". Thus, the nonmagnetic spacer layer 340 may be a crystalline MgO tunneling barrier layer. In other embodiments, the nonmagnetic spacer layer 340 may differ from the layer 320". Similarly, the pinned layer 350 may be analogous to the pinned layer 330".

Although depicted as simple layers, the free layer 310" and/or pinned layers 330" and 350 may include multiple layers, as described above. Although a magnetization is not depicted in FIG. 11, the free layer 310" and/or the pinned layers 330" and 350 may each have a perpendicular anisotropy energy that exceeds the out-of-plane demagnetization energy. Thus, the free layer 310" and/or the pinned layers 330" and 350 may each have its magnetic moment oriented perpendicular to plane. In other embodiments, the magnetic moment of the free layer 310" and/or the pinned layer 330" are each in-plane. Other orientations of the magnetic moments of the free layer 310" and/or the pinned layer 330" are possible.

Because the magnetic insertion layer 100, 100', and/or 100" is used, the magnetic junction 300" may share the benefits of the magnetic insertion layer 100, 100', and/or 100". In particular, the magnetic junction 300" may be more thermally stable when the moments are oriented perpendicular, may have a higher perpendicular anisotropy for the layers 310" and/or 330", may lower RA and/or may have improved TMR. Thus, the performance of the magnetic junction 300" may improve.

Figure 12:
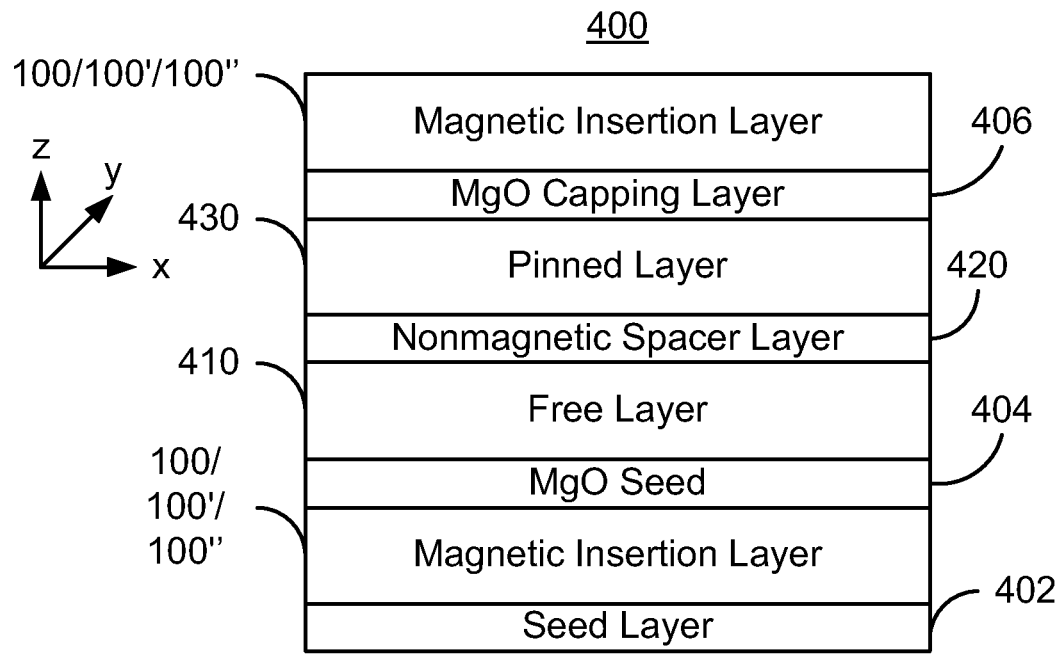
FIG. 12 depicts another exemplary embodiment of a magnetic junction using a magnetic insertion layer and switchable via spin transfer.

FIG. 12 depicts an exemplary embodiment of a magnetic junction 400 including two magnetic insertion layers such as the 100, 100', and/or 100". For clarity, FIG. 12 is not to scale. The magnetic junction 400 includes a free layer 410, a nonmagnetic spacer layer 420, a pinned layer 430, and an MgO seed layer 404 and an MgO capping layer 406. Although layers 410, 420, and 430 are shown with a particular orientation, this orientation may vary in other embodiments. For example, the pinned layer 430 may be closer to the bottom (closets to a substrate that is not shown) of the magnetic junction 400. Also shown is optional seed layer 302. A pinning layer (not shown) may also be used. In general, the pinning layer would be used if the magnetic moment of the pinned layer 430 is in plane but would not be used if the magnetic moment of the pinned layer 430 is perpendicular to plane. Such a pinning layer would be may be used to fix the magnetization (not shown) of the pinned layer 430. In some embodiments, the pinning layer may be an AFM layer or multilayer that pins the magnetization (not shown) of the pinned layer 430 by an exchange-bias interaction. The magnetic junction 400 is also configured to allow the free layer 410 to be switched between stable magnetic states when a write current is passed through the magnetic junction 400. Thus, the free layer 410 is switchable utilizing spin transfer torque.

The nonmagnetic spacer layer 420 may be a tunneling barrier layer, conductor, or other structure for which magnetoresistance is exhibited between the free layer 410 and the pinned layer 430. In some embodiments, the nonmagnetic spacer layer 420 is a crystalline MgO tunneling barrier layer. In such embodiments, the MgO seed layer 404 and the MgO capping layer 406 may be employed to improve the TMR and other characteristics of the magnetic junction 400. It is hypothesized that the presence of the MgO seed layer 404 an MgO capping layer 406 improve the crystal structure (structure and/or texture) of the tunneling barrier layer 420 because the crystalline MgO tunneling barrier layer 420 is sensitive to the surrounding structures which may affect, among other activities, deposition of layers and annealing of the magnetic junction 400

Although depicted as simple layers, the free layer 410 and/or the pinned layer 430 may include multiple layers. For example, the free layer 410 and/or the pinned layer 430 may be a SAF including magnetic layers antiferromagnetically ferromagnetically coupled through thin layers, such as Ru. In such a SAF, multiple magnetic layers interleaved with thin layer(s) of Ru or other material may be used. The free layer 410 and/or the pinned layer 430 may also be another multilayer. Although a magnetization is not depicted in FIG. 12, the free layer 410 and/or the pinned layer 430 may each have a perpendicular anisotropy energy that exceeds the out-of-plane demagnetization energy. Thus, the free layer 410 and/or the pinned layer 430 may each have its magnetic moment oriented perpendicular to plane. In other embodiments, the magnetic moment of the free layer 410 and/or the pinned layer 430 are each in-plane. Other orientations of the magnetic moments of the free layer 410 and/or the pinned layer 430 are possible.

Two magnetic insertion layers 100/100'/100" are used. One magnetic insertion layer 100/100'/100" is next to each MgO layer 404 and 406. Because the two magnetic insertion layer 100, 100', and/or 100" are used, the magnetic junction 400 may share the benefits of the magnetic insertion layer 100, 100', and/or 100". In particular, the magnetic junction 400 may be more thermally stable when the moments are oriented perpendicular, may have a higher perpendicular anisotropy for the layers 410 and/or 430, may lower RA and/or may have improved TMR. As discussed above, the magnetic insertion layers 100, 100', and/or 100" may reduce the RA of an adjacent MgO layer, such as the MgO seed layer 404 and the MgO capping layer 406. The reduction in the parasitic resistance of the MgO seed layer 404 and the MgO capping layer 406 may effectively enhance the TMR of the magnetic junction 300. Further, the RA of the MgO tunneling barrier layer 420 may be reduced by the presence of the improved MgO layers 404 and 406. Thus, the MgO tunneling barrier layer may have its RA improved by the magnetic insertion layers 100/100'/100". Thus, the RA of the magnetic junction 400 may be further reduced. Thus, the performance of the magnetic junction 400 may improve.

Figure 13:
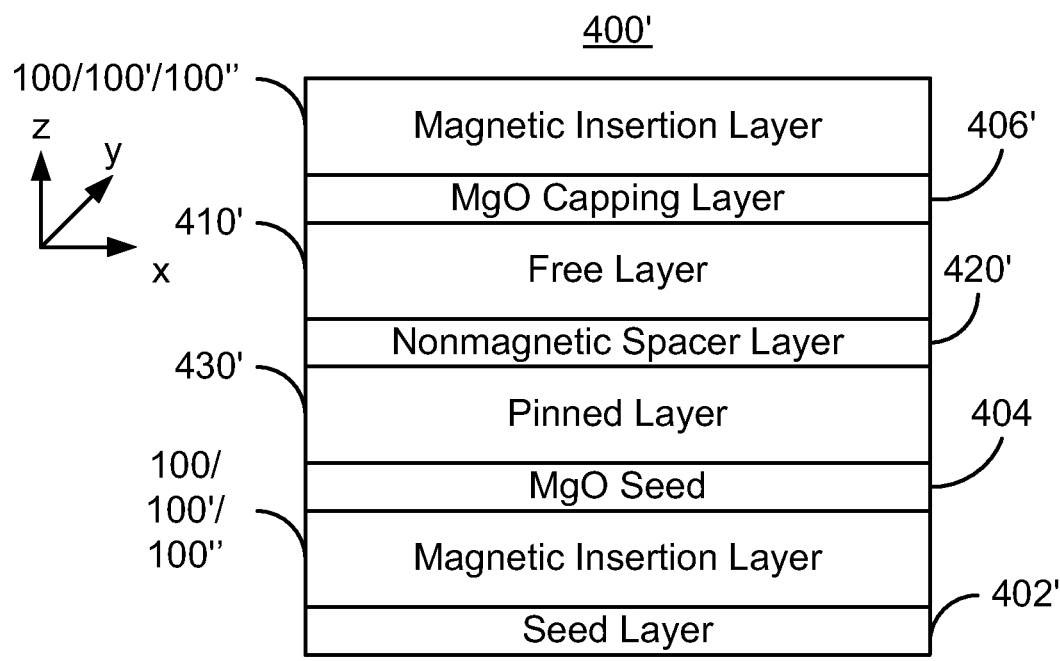
FIG. 13 depicts another exemplary embodiment of a magnetic junction using a magnetic insertion layer and switchable via spin transfer.

FIG. 13 depicts an exemplary embodiment of a magnetic junction 400' including two magnetic insertion layers 100/100'/100". For clarity, FIG. 13 is not to scale. The magnetic junction 400' is analogous to the magnetic junction 400. Thus, analogous layers are labeled similarly. The magnetic junction 400' includes a free layer 410', a nonmagnetic spacer layer 420', and a pinned layer 430' analogous to the layers 410, 420, and 430, respectively. Although layers 410', 420', and 430' are shown with a particular orientation, this orientation may vary in other embodiments. Also shown are MgO seed layer 404', MgO capping layer 406', and the magnetic insertion layers 100/100'/100". In some embodiments, an optional pinning layer (not shown) may be included. The magnetic junction 400' is also configured to allow the free layer 410' to be switched between stable magnetic states when a write current is passed through the magnetic junction 400'. Thus, the free layer 410' is switchable utilizing spin transfer torque.

The nonmagnetic spacer layer 420' may be a tunneling barrier layer, conductor, or other structure for which magnetoresistance is exhibited between the free layer 410' and the pinned layer 430'. In some embodiments, the nonmagnetic spacer layer 420' is a crystalline MgO tunneling barrier layer. In such embodiments, the MgO seed layer 404' and the MgO capping layer 406' may be employed to improve the TMR and other characteristics of the magnetic junction 400'.

Although depicted as simple layers, the free layer 410' and/or pinned layer 430' may include multiple layers, as described above. Although a magnetization is not depicted in FIG. 13, the free layer 410' and/or the pinned layer 430' may each have a perpendicular anisotropy energy that exceeds the out-of-plane demagnetization energy. Thus, the free layer 410' and/or the pinned layer 430' may each have its magnetic moment oriented perpendicular to plane. In other embodiments, the magnetic moment of the free layer 410' and/or the pinned layer 430' are each in-plane. Other orientations of the magnetic moments of the free layer 410' and/or the pinned layer 430' are possible.

Because the magnetic insertion layers 100, 100', and/or 100" are used, the magnetic junction 400' may share the benefits of the magnetic insertion layer 100, 100', and/or 100". In particular, the magnetic junction 400' may be more thermally stable when the moments are oriented perpendicular, may have a higher perpendicular anisotropy for the layers 410' and/or 430', may lower RA and/or may have improved TMR. Thus, the performance of the magnetic junction 400' may improve.

Figure 14:
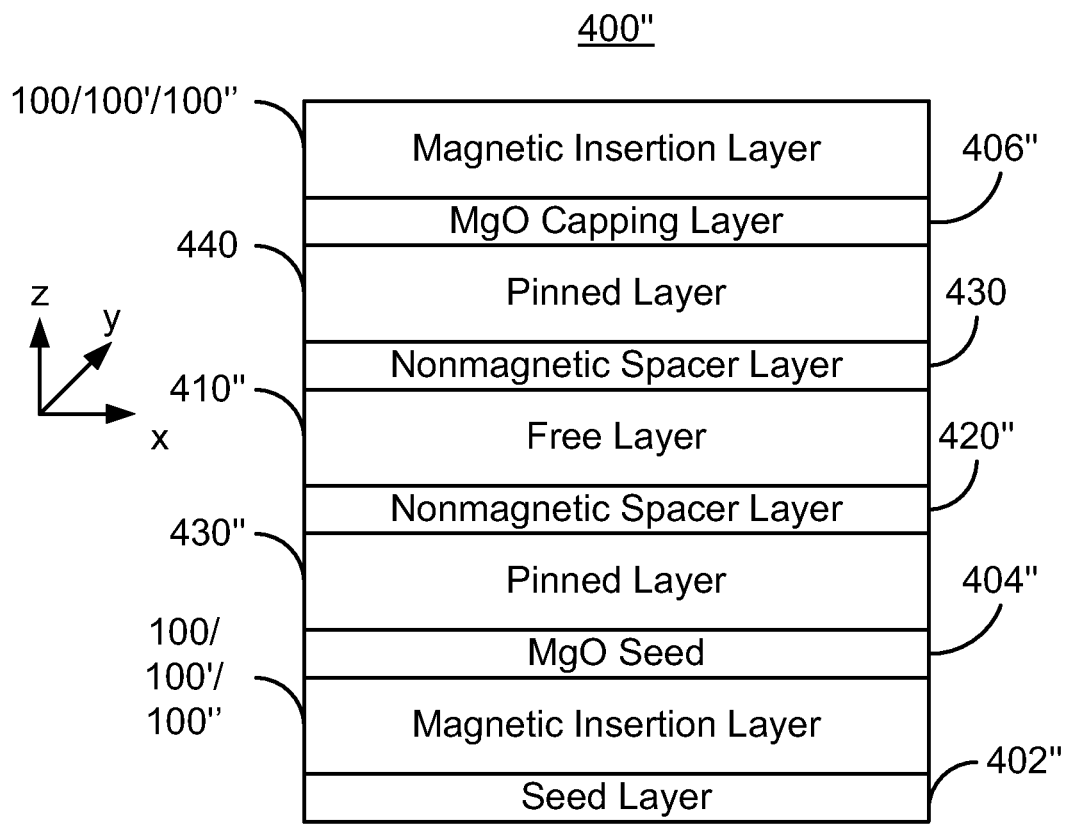
FIG. 14 depicts another exemplary embodiment of a magnetic junction using a magnetic insertion layer and switchable via spin transfer.

FIG. 14 depicts an exemplary embodiment of a magnetic junction 400" including two magnetic insertion layers 100/100'/100". For clarity, FIG. 14 is not to scale. The magnetic junction 400" is analogous to the magnetic junctions 400, and/or 400'. Thus, analogous layers are labeled similarly. The magnetic junction 400" includes a free layer 410", a nonmagnetic spacer layer 420", and a pinned layer 430" analogous to the layers 410/410', 420/420', and 430/430', respectively. Although layers 410", 420", and 430" are shown with a particular orientation, this orientation may vary in other embodiments. Also shown are MgO seed layer 404", MgO capping layer 406" and the adjoining magnetic insertion layers 100/100'/100". In some embodiments, an optional pinning layer (not shown) may be included. The magnetic junction 400" is also configured to allow the free layer 410" to be switched between stable magnetic states when a write current is passed through the magnetic junction 400". Thus, the free layer 410" is switchable utilizing spin transfer torque.

The nonmagnetic spacer layer 420" may be a tunneling barrier layer, conductor, or other structure for which magnetoresistance is exhibited between the free layer 310" and the pinned layer 430". In some embodiments, the nonmagnetic spacer layer 420" is a crystalline MgO tunneling barrier layer. As discussed above, in such embodiments, the MgO seed layer 404" and MgO capping layer 406" may be employed to improve the TMR and other characteristics of the magnetic junction 400".

In addition, the magnetic junction 400" is a dual structure. Thus, the magnetic junction 400" also includes an additional nonmagnetic spacer layer 440 and an additional pinned layer 450. The nonmagnetic spacer layer 440 may be analogous to the nonmagnetic spacer layer 420". Thus, the nonmagnetic spacer layer 440 may be a crystalline MgO tunneling barrier layer. In other embodiments, the nonmagnetic spacer layer 440 may differ from the layer 420". Similarly, the pinned layer 450 may be analogous to the pinned layer 430".

Although depicted as simple layers, the free layer 410" and/or pinned layers 430" and 450 may include multiple layers, as described above. Although a magnetization is not depicted in FIG. 15, the free layer 410" and/or the pinned layers 430" and 450 may each have a perpendicular anisotropy energy that exceeds the out-of-plane demagnetization energy. Thus, the free layer 410" and/or the pinned layers 430" and 450 may each have its magnetic moment oriented perpendicular to plane. In other embodiments, the magnetic moment of the free layer 410" and/or the pinned layer 430" are each in-plane. Other orientations of the magnetic moments of the free layer 410" and/or the pinned layer 430" are possible.

Because the magnetic insertion layers 100, 100', and/or 100" are used, the magnetic junction 400" may share the benefits of the magnetic insertion layer 100, 100', and/or 100". In particular, the magnetic junction 400" may be more thermally stable when the moments are oriented perpendicular, may have a higher perpendicular anisotropy for the layers 410" and/or 430", may lower RA and/or may have improved TMR. Thus, the performance of the magnetic junction 400" may improve.

Figure 15:
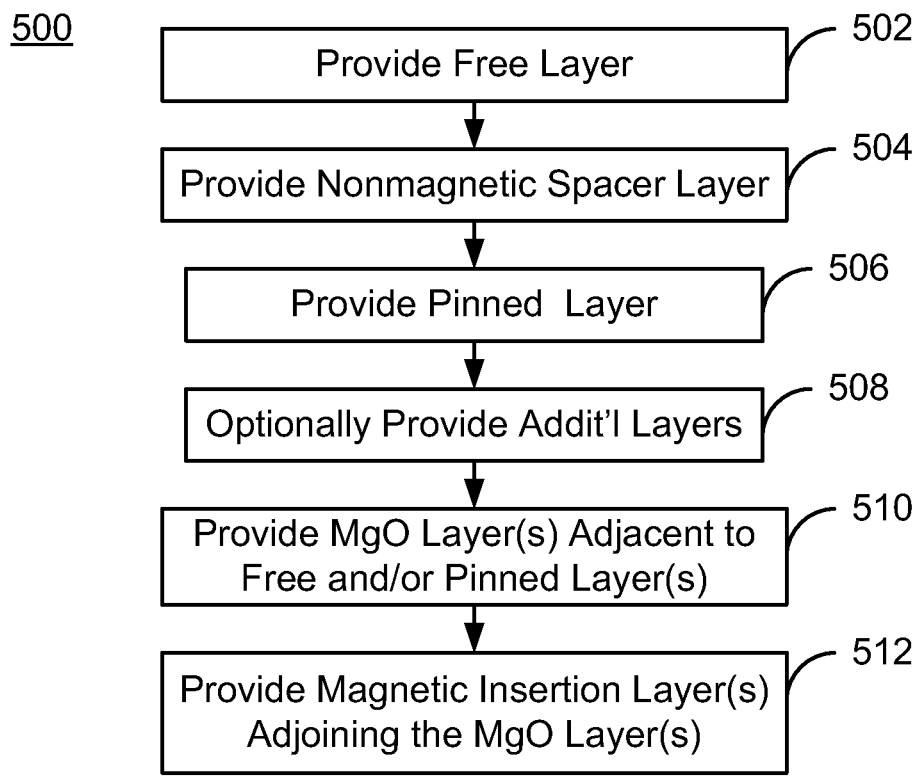
FIG. 15 an exemplary embodiment of a method for fabricating a magnetic junction including a magnetic substructure.

FIG. 15 depicts an exemplary embodiment of a method 500 for fabricating magnetic substructure. For simplicity, some steps may be omitted, combined, and/or interleaved. The method 500 is described in the context of the magnetic junction 200. However, the method 500 may be used on other magnetic junctions such as the junctions 200', 200" 200''', 300, 300', 300", 400, 400', and/or 400". Further, the method 500 may be incorporated into fabrication of magnetic memories. Thus the method 500 may be used in manufacturing a STT-RAM or other magnetic memory. The method 500 may also include providing the seed layer(s) 202 and optional pinning layer (not shown).

The free layer 210 is provided, via step 502. Step 502 may include depositing the desired materials at the desired thickness of the free layer 210. Further, step 502 may include providing a SAF. The nonmagnetic layer 220 is provided, via step 504. Step 504 may include depositing the desired nonmagnetic materials, including but not limited to crystalline MgO. In addition, the desired thickness of material may be deposited in step 504.

The pinned layer 230 is provided, via step 506. Step 506 may include depositing the desired materials at the desired thickness of the pinned layer 230. Further, step 508 may include providing a SAF. Any additional layers, such as layers 240 and 250 may optionally be provided, via step 508. Any MgO layers such as the layer 204 may be provide, via step 510. Similarly, MgO capping layers such as the layers 304 and 406 may also be provided in step 510. Thus, a portion of step 510 may be performed before step 502. The magnetic insertion layers 100/100'/100" may be provided next to an MgO layer 204, via step 512. For the magnetic junction 200, the magnetic insertion layer 100/100'/100" is provided before step 502. However, for magnetic junctions using MgO capping layers, step 512 may include providing a magnetic insertion layer 100/100'/100" after step 508 and/or 510 are performed. Thus, using the method 500, the benefits of the magnetic insertion layers 100/100'/100" and magnetic junctions 200, 200', 200", 200''', 300, 300', 300", 400, 400', and/or 400" may be achieved.

Figure 16:
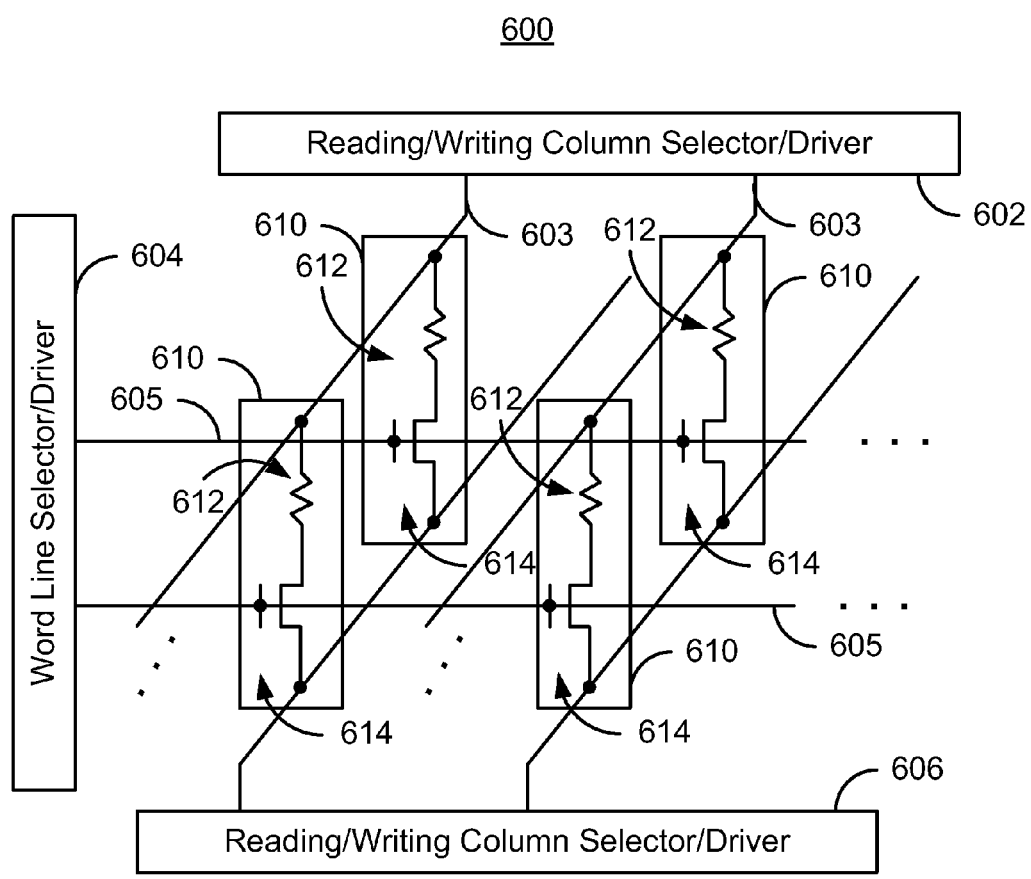
FIG. 16 depicts an exemplary embodiment of a memory utilizing magnetic junctions in the memory element(s) of the storage cell(s).

Further, the magnetic junctions 200, 200', 200", 200''', 300, 300', 300", 400, 400', and/or 400" may be used in a magnetic memory. FIG. 16 depicts an exemplary embodiment of one such memory 600. The magnetic memory 600 includes reading/writing column select drivers 602 and 606 as well as word line select driver 604. Note that other and/or different components may be provided. The storage region of the memory 600 includes magnetic storage cells 610. Each magnetic storage cell includes at least one magnetic junction 612 and at least one selection device 614. In some embodiments, the selection device 614 is a transistor. The magnetic junctions 612 may include one or more of the magnetic junctions 200, 200', 200", 200''', 300, 300', 300", 400, 400', and/or 400". Although one magnetic junction 612 is shown per cell 610, in other embodiments, another number of magnetic junctions 612 may be provided per cell.

Various magnetic insertion layers 100, 100', and 100" as well as magnetic junctions 200, 200', 200", 200''', 300, 300', 300", 400, 400', and/or 400" have been disclosed. Note that various features of the magnetic insertion layers 100, 100', and/or 100" and the magnetic junctions 200, 200', 200", 200''', 300, 300', 300", 400, 400', and/or 400" may be combined. Thus, one or more of the benefits of the magnetic junctions 200, 200', 200", 200''', 300, 300', 300", 400, 400', and/or 400" such as reduced RA, improved perpendicular anisotropy, greater thermal stability, and/or higher TMR may be achieved.

A method and system for providing a magnetic insertion layer, a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction having a magnetoresistive region and being for use in a magnetic device comprising:

a pinned layer;

a nonmagnetic spacer layer;

a free layer, the nonmagnetic spacer layer residing between the pinned layer and the free layer, at least a portion of the magnetoresistive region being between the pinned layer and the free layer;

at least one insulating layer adjacent to at least one of the free layer and the pinned layer such that the at least one of the free layer and the pinned layer are between the at least one insulating layer and the nonmagnetic spacer layer and the at least one insulating layer is external to the magnetoresistive region; and at least one magnetic insertion layer adjoining the at least one insulating layer, the at least one magnetic insertion layer being external to the magnetoresistive region of the magnetic junction;

wherein the magnetic junction is configured such that the free layer is switchable between a plurality of stable magnetic states when a write current is passed through the magnetic junction.

2. The magnetic junction of claim 1 wherein the at least one insulating layer includes at least one of magnesium oxide, aluminum oxide, tantalum oxide, ruthenium oxide, titanium oxide, and nickel oxide.

3. The magnetic junction of claim 1 wherein the at least one insulating layer consists of at least one MgO layer.

4. The magnetic junction of claim 3 wherein the at least one magnetic insertion layer includes a magnetic layer consisting of at least one of CoX, FeX, and CoFeX, where X is selected from B, Ge, Hf, Zr, Ti, Ta and, Tb.

5. The magnetic junction of claim 4 wherein the at least one magnetic insertion layer further includes an additional magnetic layer.

6. The magnetic junction of claim 5 wherein the additional magnetic layer includes at least one of co and Fe.

7. The magnetic junction of claim 4 wherein the at least one magnetic insertion layer further includes an additional magnetic layer consisting of at least one of CoY, FeY, and CoFeY, where Y is selected from B, Ge, Hf, Zr, Ti, Ta and, Tb.

8. The magnetic junction of claim 4 wherein the at least one MgO layer is a seed layer adjoining the free layer.

9. The magnetic junction of claim 4 wherein the at least one MgO layer is a seed layer adjoining the pinned layer.

10. The magnetic junction of claim 4 wherein the at least one MgO layer is a capping layer adjoining the free layer.

11. The magnetic junction of claim 4 wherein the at least one MgO layer is a capping layer adjoining the pinned layer.

12. The magnetic junction of claim 4 wherein the at least one MgO layer includes a first MgO layer adjoining the free layer and a second MgO layer adjoining the pinned layer.

13. The magnetic junction of claim 12 wherein the at least one magnetic insertion layer includes a first magnetic insertion layer adjoining the first MgO layer and a second insertion layer adjoining the pinned layer.

14. The magnetic junction of claim 3 wherein the free layer has a free layer perpendicular anisotropy greater than a free layer out-of-plane demagnetization energy.

15. The magnetic junction of claim 14 wherein the pinned layer has a pinned layer perpendicular anisotropy greater than a pinned layer out-of-plane demagnetization energy.

16. A magnetic memory comprising:
a plurality of magnetic storage cells, each of the plurality of magnetic storage cells including at least one magnetic junction having a magnetoresistive region, the at least one magnetic junction including a pinned layer, a nonmagnetic spacer layer, a free layer, at least one insulating layer, and at least one magnetic insertion layer, the nonmagnetic spacer layer residing between the pinned layer and the free layer, at least a portion of the magnetoresistive region being between the pinned layer and the free layer, the at least one insulating layer being adjacent to at least one of the free layer and the pinned layer such that the at least one of the free layer and the pinned layer are between the at least one insulating layer and the nonmagnetic spacer layer and the at least one insulating layer is external to the magnetoresistive region, the at least one magnetic insertion layer adjoining the at least one insulating layer, the at least one magnetic insertion layer being external to the magnetoresistive region, the magnetic junction being configured such that the free layer is switchable between a plurality of stable magnetic states when a write current is passed through the magnetic junction; and
a plurality of bit lines.

17. The magnetic memory of claim 16 wherein the at least one insulating layer includes at least one of magnesium oxide, aluminum oxide, tantalum oxide, ruthenium oxide, titanium oxide, and nickel oxide.

18. The magnetic junction of claim 1 wherein the at least one insulating layer consists of at least one MgO layer.

19. The magnetic memory of claim 18 wherein the at least one magnetic insertion layer includes a magnetic layer consisting of at least one of CoX, FeX, and CoFeX, where X is selected from B, Ge, Hf, Zr, Ti, Ta and, Tb.

20. The magnetic memory of claim 19 wherein the at least one magnetic insertion layer further includes an additional magnetic layer.

21. The magnetic memory of claim 20 wherein the additional magnetic layer includes at least one of co and Fe.

22. The magnetic memory of claim 19 wherein the at least one magnetic insertion layer further includes an additional magnetic layer consisting of at least one of CoY, FeY, and CoFeY, where Y is selected from B, Ge, Hf, Zr, Ti, Ta and, Tb.

23. The magnetic memory of claim 19 wherein the at least one MgO layer is a seed layer adjoining the free layer.

24. The magnetic memory of claim 19 wherein the at least one MgO layer is a seed layer adjoining the pinned layer.

25. The magnetic memory of claim 19 wherein the at least one MgO layer is a capping layer adjoining the free layer.

26. The magnetic memory of claim 19 wherein the at least one MgO layer is a capping layer adjoining the pinned layer.

27. The magnetic memory of claim 19 wherein the at least one MgO layer includes a first MgO layer adjoining the free layer and a second MgO adjoining the pinned layer.

28. The magnetic memory of claim 27 wherein the at least one magnetic insertion layer includes a first magnetic insertion layer adjoining the first MgO layer and a second insertion layer adjoining the pinned layer.

29. The magnetic memory of claim 18 wherein the free layer has a free layer perpendicular anisotropy greater than a free layer out-of-plane demagnetization energy.

30. The magnetic memory of claim 18 wherein the pinned layer has a pinned layer perpendicular anisotropy greater than a pinned layer out-of-plane demagnetization energy.

31. A method for providing a magnetic junction having a magnetoresistive region and being for use in a magnetic device comprising:
providing a pinned layer;
providing a nonmagnetic spacer layer;
providing a free layer, the nonmagnetic spacer layer residing between the pinned layer and the free layer, at least a portion of the magnetoresistive region being between the pinned layer and the free layer;
providing at least one MgO layer adjacent to at least one of the free layer and the pinned layer such that the at least one of the free layer and the pinned layer are between the at least one insulating layer and the nonmagnetic spacer layer and the at least one insulating layer is external to the magnetoresistive region; and
providing at least one magnetic insertion layer adjoining the at least one MgO layer;
wherein the magnetic junction is configured such that the free layer is switchable between a plurality of stable magnetic states when a write current is passed through the magnetic junction.

32. The magnetic element of claim 1 wherein the magnetic insertion layer is configured to be nonmagnetic.

33. The magnetic element of claim 32 wherein the magnetic insertion layer includes at least one magnetic material.

34. The magnetic element of claim 1 wherein the magnetic insertion layer does not adjoin a pinning structure.

* * * * *